(12) United States Patent
Shin et al.

(10) Patent No.: US 7,514,718 B2
(45) Date of Patent: Apr. 7, 2009

(54) LED PACKAGE, MANUFACTURING METHOD THEREOF, AND LED ARRAY MODULE USING THE SAME

(75) Inventors: Kyu-ho Shin, Seoul (KR); Su-ho Shin, Seongnam-si (KR); Soon-cheol Kweon, Seoul (KR); Chang-youl Moon, Suwon-si (KR); Jin-seung Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 214 days.

(21) Appl. No.: 11/405,567

(22) Filed: Apr. 18, 2006

(65) Prior Publication Data

US 2006/0279949 A1 Dec. 14, 2006

(30) Foreign Application Priority Data

Jun. 10, 2005 (KR) .................. 10-2005-0049896

(51) Int. Cl.
*H01L 27/15* (2006.01)

(52) U.S. Cl. ........................ 257/81; 257/704
(58) Field of Classification Search ................ 257/712, 257/704, 81
See application file for complete search history.

(56) References Cited

U.S. PATENT DOCUMENTS

| 5,925,898 | A  | * | 7/1999 | Spath .......................... 257/98 |
| 6,858,879 | B2 | * | 2/2005 | Waitl et al. ..................... 257/99 |
| 6,949,771 | B2 | * | 9/2005 | Yoganandan et al. .......... 257/99 |
| 7,347,603 | B2 | * | 3/2008 | Ikeda et al. .................. 362/555 |

* cited by examiner

*Primary Examiner*—Roy K Potter
(74) *Attorney, Agent, or Firm*—Sughrue Mion, PLLC

(57) ABSTRACT

An LED package includes a substrate, an LED, and a cap. The substrate includes a first conductor unit, a second conductor unit, and a non-conductor unit which electrically insulates the first and second conductor unit. The LED is bonded to the first conductor unit. The cap is mounted on the substrate over the LED and comprises a conductive wire which connects the LED to the second conductor unit.

20 Claims, 17 Drawing Sheets

LED PACKAGE, MANUFACTURING METHOD THEREOF, AND LED ARRAY MODULE USING THE SAME

CROSS-REFERENCE TO RELATED PATENT APPLICATIONS

This application claims priority under 35 U.S.C. § 119 from Korean Patent Application No. 2005-49896, filed on Jun. 10, 2005, the entire content of which is incorporated herein by reference.

BACKGROUND OF THE INVENTION

1. Field of the Invention

Methods and apparatuses consistent with the present invention relate to a light emitting diode (LED) package that can be used as a backlight unit of an LCD and a lighting apparatus, a manufacturing method thereof, and an LED array module using the same.

2. Description of the Related Art

LEDs are popular in the fields of advertising and electronics due to their long lifespan and low power consumption. There have also been attempts to use LEDs in backlight units of LCDs. It is also expected that LEDs will be used in indoor or outdoor lighting apparatuses in the near future. As the application range of LEDs is expanded, there are increasing demands for LED packages which are compact and can easily dissipate heat.

LEDs used in backlight units for LCDs or in lighting apparatuses require high power consumption. However, when the temperature rises, the performance of LEDs exponentially decays. Therefore, thermal management of LED packages is important.

FIG. 1 is a schematic cross-sectional view illustrating one example of a conventional LED package. Referring to FIG. 1, the LED package includes an LED 1, a heat spreading member 2 on which the LED 1 is mounted, leads 3 and 3', wires 4 and 4' for electrically connecting the LED 1 to the leads 3 and 3', and a body 5 surrounding the heat spreading member 2 and the leads 3 and 3'.

The upper and lower portions of the heat spreading member 2 are exposed. An insulation layer 6 is disposed on the heat spreading member 2. The LED 1 is bonded to the center of the insulation layer 6 by an adhesive 7. First ends of the leads 3 and 3' are disposed at both sides of the insulation layer 6. The second ends of the leads 3 and 3' are externally protruded from both sides of the body 5. The wires 4 and 4' are installed to connect the LED 1 to the first ends of the leads 3 and 3'. Although not illustrated, a cap for sealing up the LED 1 can be installed over the upper portion of the body 5.

The LED package is mounted on a substrate 10 and the second end of the leads 3 and 3' are mounted on soldering pads 11 and 11'. In addition, solder 12 is disposed between the heat spreading member 2 of the LED package and the substrate 10. The heat generated in the LED 1 is dissipated to the atmosphere through the heat spreading member 2, the solder 12, and the substrate 10.

However, conventional LED packages, such as illustrated in FIG. 1, have relatively long heat transfer paths (e.g. LED-insulation layer-heat spreading member-solder-substrate). As a result, conventional LED packages exhibit low heat dissipation performance due to an increase in thermal resistance, and thus are not suitable for high power LED packages.

Thermal resistance Rth can be represented by Rth=L/ (k*A). That is, when the thickness or the heat transfer path L decreases, and when the thermal conductivity k and the heat transfer area A increase, the thermal resistance Rth decreases. However, in a conventional LED package, the heat transfer path is lengthened by the thickness of the package itself and the substrate, and contact thermal resistance between different materials of LED package increases. Therefore, the overall thermal resistance of LED package increases.

When heat dissipation performance of an LED package is low, the LED lifespan is reduced, and peripheral components may deteriorate and become thermally deformed due to the high temperature, which may cause fatal damages to the system.

Additionally, conventional LED packages require many connections by wire bonding process. When an LED array module is formed by using such conventional LED packages, the number of assembly processes required, including a process for soldering the plurality of packages on the substrate, is large, and thus the production cost is high.

SUMMARY OF THE INVENTION

Accordingly, it is one object of the present invention to provide a high power LED package with excellent heat dissipation performance, which can be manufactured at a low cost, and a manufacturing method thereof.

Another object of the present invention is to provide an LED array module using the LED package and the manufacturing method thereof.

According to an exemplary embodiment of the present invention, an LED package, comprises: a substrate, an LED mounted on the substrate, and a cap mounted on the substrate over the LED. The substrate comprises a first conductor unit, a second conductor unit, and a non-conductor unit which electrically insulates the first and second conductor units. The cap comprises a conductive wire which connects the LED to the second conductor unit. The cap seals the LED over the substrate.

The first conductor unit may comprise a heat dissipation unit, which externally dissipates heat generated in the LED, and a first electrode unit. The second conductor unit may comprise a second electrode unit connected to the LED via the conductive wire of the cap.

The heat dissipation unit may be exposed through the top and bottom surfaces of the substrate, and the first and second electrode units may be exposed through the top surface of the substrate. That is, the first electrode unit can be exposed through the bottom surface of the substrate, and the second electrode unit can be exposed through the top surface of the substrate.

A cavity may be formed on the heat dissipation unit, and the LED may be bonded to the bottom surface of the cavity by a conductive adhesive. The conductive adhesive can be made of Ag-Epoxy, Ag paste or solder to supply power to the LED through the heat dissipation unit.

When an upper exposed surface (on which the LED is bonded) of the heat dissipation unit is smaller than the lower exposed surface, the heat transfer area is enlarged and heat transfer is facilitated in the lateral direction of the package.

The cap may comprise a lens directs the light emitted from the LED in a predetermined direction. The lens can be composed of one hemispherical lens or an array of a plurality of micro lenses. When the lens is composed of the array of micro lenses, the thickness of the package is reduced and the cap is easily manufactured.

The conductive wire is installed on the surface of the cap opposite to the surface on which the lens has been installed. A first end of the conductive wire is connected to a top surface of the LED, and a second end thereof is connected to a top end of the second electrode unit.

According to another exemplary aspect of the invention, there is provided an LED package, comprising: an LED, a substrate, and a connection member. The substrate comprises a first conductor unit comprising a heat dissipation unit, which is exposed at an upper surface of the substrate and a lower surface of the substrate and which provides a heat transfer path for the LED, and a first electrode unit. The substrate also comprises a second conductor unit comprising a second electrode unit. The substrate also comprises a non-conductor unit which insulates the first electrode unit from the second electrode unit. The connection member connects the LED to the second electrode unit. The LED is bonded to an upper surface of the heat dissipation unit. The connection member may be a metal wire.

According to yet another exemplary aspect of the invention, there is provided a method of manufacturing an LED package, comprising: a) manufacturing a substrate comprising a first conductor unit, a second conductor unit, and a non-conductor unit. The first conductor unit comprises a heat dissipation unit, which is exposed at an upper surface of the substrate and a lower surface of the substrate, and which provides a heat transfer path for an LED, and a first electrode unit. The second conductor unit comprises a second electrode unit. The non-conductor unit insulates the first electrode unit from the second electrode unit. The method further comprises: b) bonding an LED to the heat dissipation unit; and c) simultaneously electrically connecting an LED to the second electrode unit and sealing the LED.

Step a) may comprise the steps of: a1) depositing a first insulator on a base; a2) etching part of the first insulator; a3) depositing a metal in the etched part of the first insulator, thereby forming a first conductor unit part; a4) depositing a second insulator on the first insulator having the metal deposited therein; a5) etching part of the second insulator, thereby forming a first conductor unit part and a second conductor unit part; a6) depositing metal in the first conductor unit part and the second conductor unit part of the second insulator; a7) depositing a third insulator on the second insulator having the metal deposited therein; a8) etching the third insulator, thereby forming a heat dissipation unit part, a first electrode unit part, and a second electrode unit part; and a9) depositing metal in the heat dissipation unit part and the first and second electrode unit parts of the third insulator.

Step a) may further comprise a step a10) forming a cavity of a predetermined depth in the heat dissipation unit.

Step a) may comprise applying a photolithography process to the substrate, thereby making the substrate partially non-conductive and insulating the first conductor unit from the second conductor unit; performing an oxidation process; and forming a cavity of a predetermined depth in the first conductor unit. The substrate may be an aluminum.

Step c) may comprise: c1) manufacturing a cap having a conductive wire for connecting the LED to the second conductor unit, and a lens for directing the light emitted from the LED in a predetermined direction; and c2) position-determining and bonding the cap to the substrate.

Step c1) can comprise forming a lens by injection-molding a transparent material such as polymer or glass, and depositing a conductive wire. Step c1) may alternately comprise forming a plurality of micro lenses by dispensing liquid droplets on a transparent plate such as polymer or glass, and depositing a conductive wire. The conductive wire may be indium tin oxide (ITO).

Step c2) may comprise positioning solder bumps between the conductive wire and the LED and between the conductive wire and the second electrode unit, and heating and compressing the resultant structure. Step c2) may alternately comprise positioning solder bumps between the conductive wire and the LED and between the conductive wire and the second electrode unit; positioning an adhesive between the cap and the substrate; and bonding the resultant structure. Step c2) may alternately comprise positioning solder bumps between the conductive wire and the LED and between the conductive wire and the second electrode unit; positioning solder bumps between the cap and the substrate; and soldering the resultant structure.

According to yet another exemplary aspect of the invention, there is provided a method of manufacturing an LED package, comprising the step of: a) manufacturing a substrate. The substrate comprises a first conductor unit, a second conductor unit, and a non-conductor unit. The first conductor unit comprises a heat dissipation unit, which is exposed at an upper surface of the substrate and a lower surface of the substrate, and which provides a heat transfer path for an LED, and a first electrode unit. The second conductor unit comprises a second electrode unit. The non-conductor unit insulates the first electrode unit from the second electrode unit. The method also comprises: b) bonding an LED to the heat dissipation unit; and c) electrically connecting the LED to the second electrode unit.

Step c) may comprise connecting the LED to the second electrode unit via a metal wire. The manufacturing method may further comprise sealing the LED.

According to yet another exemplary aspect of the invention, there is provided an LED array module, comprising: a plurality of LEDs; a substrate; and a cap. The LEDs are bonded to the substrate at predetermined intervals. The substrate comprises a plurality of first conductor units; a plurality of second conductor units; and a non-conductor unit. The first conductor units each have a heat dissipation unit, which is exposed at an upper surface of the substrate and a lower surface of the substrate, and which provides a heat transfer path for an LED, and a first electrode units. The second conductor units each have a second electrode unit. and the non-conductor unit insulates the first electrode unit from the second electrode unit. The module also comprises a cap comprising a plurality of conductive wires, each of which connects on of the plurality of LEDs to one of the plurality of second electrode units, wherein an installation of the cap simultaneously connects the plurality of LEDs to the plurality of second electrode units via the plurality of conductive wires, and forms a seal over the LEDs.

The cap may comprise a lens for directing the light emitted from the LED in a predetermined direction. The lens can be composed of a plurality of hemispherical lenses, where the number of the plurality of lenses is equal to the number of the plurality of LEDs, or an array of a plurality of micro lenses.

BRIEF DESCRIPTION OF THE DRAWINGS

The above and other exemplary aspects of the present invention will become more apparent from the following detailed description of exemplary embodiments of the present invention with reference to the accompanying drawings, in which.

DETAILED DESCRIPTION OF EXEMPLARY EMBODIMENTS OF THE INVENTION

An LED package, a manufacturing method thereof and an LED array module using the same in accordance with exemplary embodiments of the present invention will now be described in detail with reference to the accompanying drawings. Well-known functions or constructions are not described in detail since they would obscure the invention in unnecessary detail.

Figure 1:
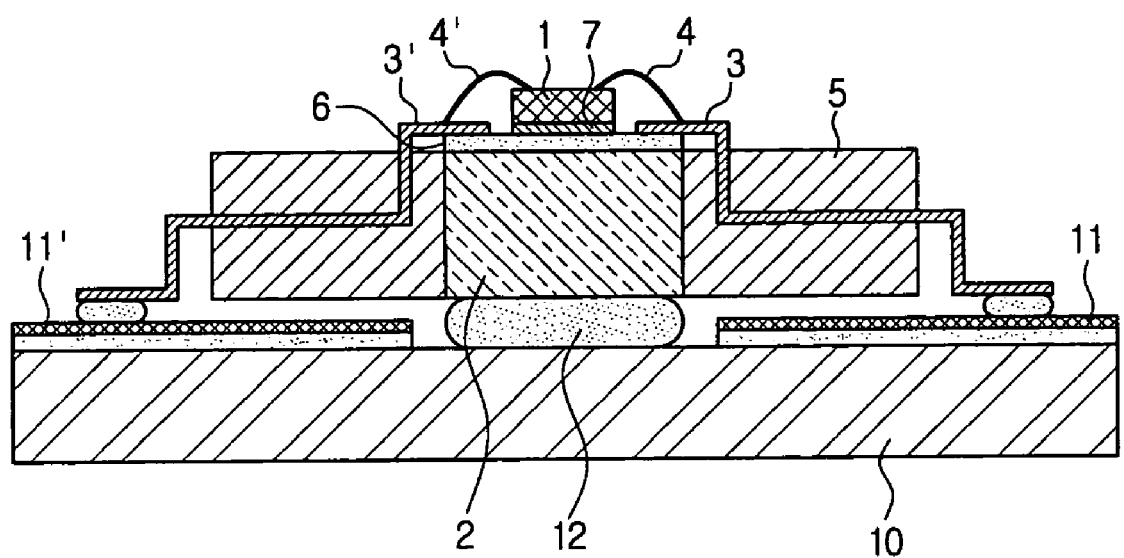
FIG. 1 is a cross-sectional view of a conventional LED package.
Figure 2:
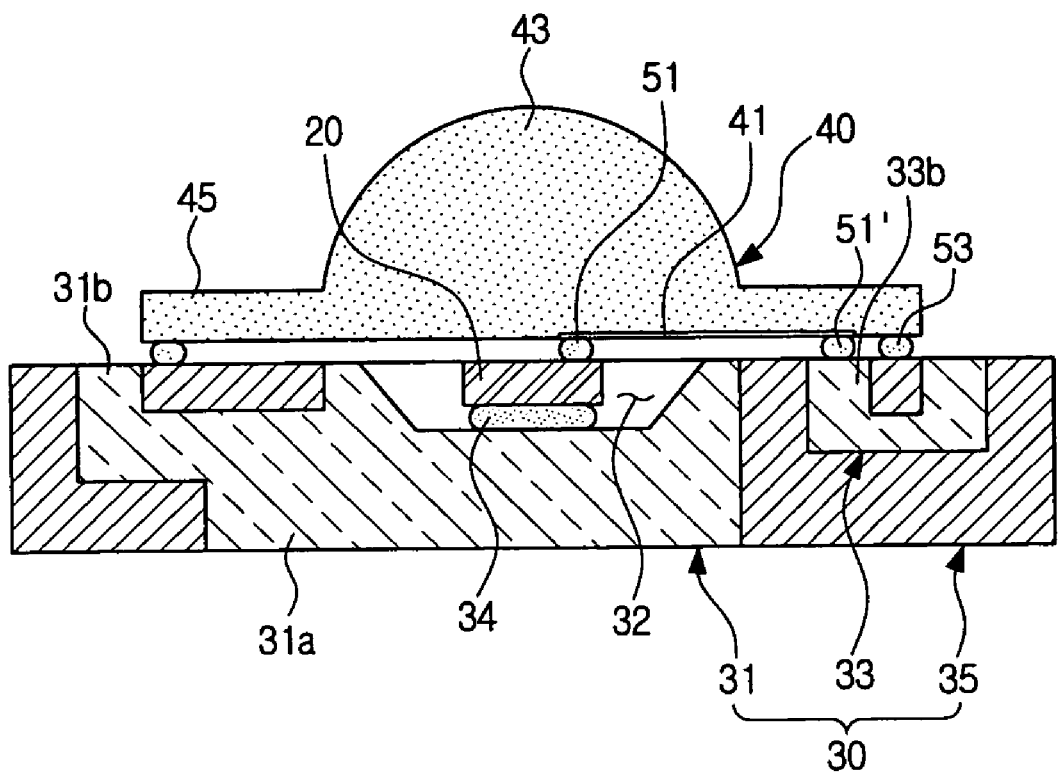
FIG. 2 is a cross-sectional view of an LED package in accordance with an exemplary embodiment of the present invention.
Figure 3:
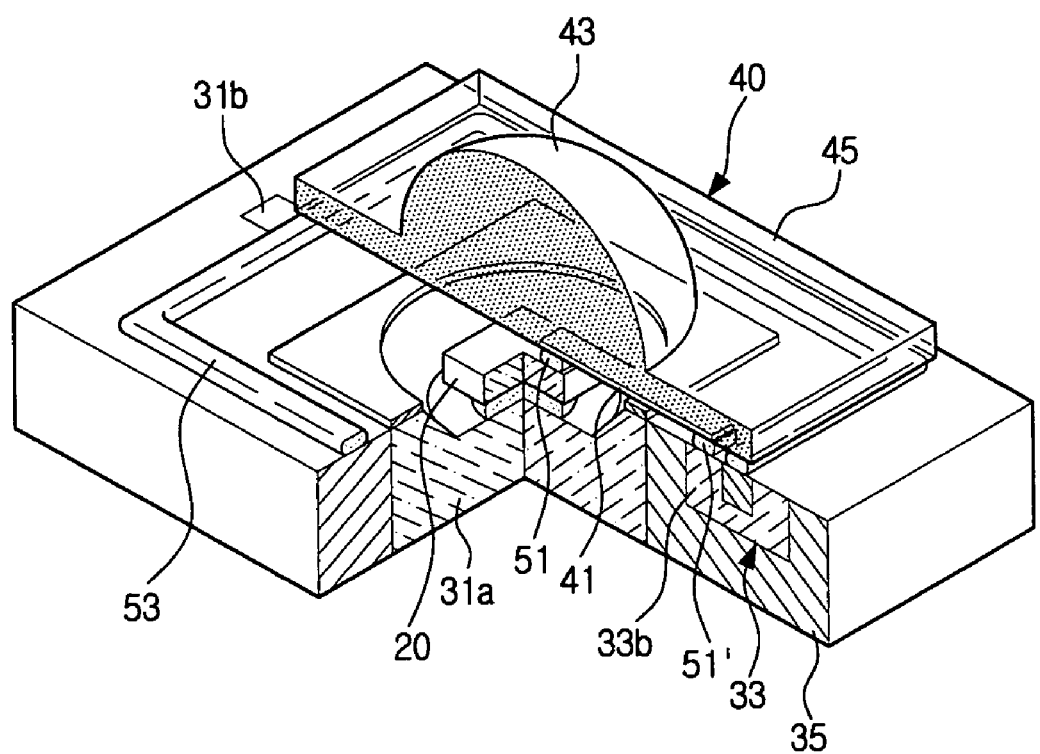
FIG. 3 is a partially-cut perspective view of the LED package of FIG. 2.

As illustrated in FIGS. 2 and 3, in accordance with one embodiment of the present invention, an LED package includes an LED 20, a substrate 30 on which the LED 20 is mounted, and a cap 40 for sealing up and electrically connecting the LED 20.

The substrate 30 includes at least two first and second conductor units 31 and 33, and a non-conductor unit 35 for electrically insulating the conductor units 31 and 33. The first conductor unit 31 includes a heat dissipation unit 31a used as a heat transfer path of the LED 20, and a first electrode unit 31b for power supply. The second conductor unit 33 includes a second electrode unit 33b for power supply.

The heat dissipation unit 31a is exposed through the top and bottom surfaces of the substrate 30. The first electrode unit 31b and the second electrode unit 33b are exposed through the top surface of the substrate 30. A cavity 32 is formed in the top surface of the heat dissipation unit 31a at a predetermined depth. The LED 20 is bonded to the bottom surface of the cavity 32 by a conductive adhesive 34. The conductive adhesive 34 may be made of Ag-Epoxy, Ag paste, or solder to supply power to the LED 20 through the heat dissipation unit 31a.

Accordingly, the first electrode unit 31b and the LED 20 are electrically connected to each other, and the heat generated in the LED 20 is easily transferred through the heat dissipation unit 31a. Thus, the heat transfer path is shortened, and connecting portions of different materials are reduced in the heat transfer path. As a result, thermal resistance is minimized, improving the heat dissipation performance.

In addition, the exposed top surface of the heat dissipation unit 31a, namely, the LED installation surface, is smaller than the exposed bottom surface thereof. Therefore, heat transfer is facilitated in the lateral direction of the package as well as the thickness direction, and the heat transfer area is widened, improving heat dissipation effects. The conductor units 31 and 33 may be made of aluminum or copper having high heat conductivity, and the non-conductor unit 35 may be made of any one of a number of insulators such as polymers including polyimide, epoxy and FR4 and metal oxides including ceramic and $Al_2O_3$.

The cap 40 is installed on the substrate 30 to seal the LED 20. The cap 40 includes a conductive wire 41 for electrically connecting the LED 20 to the second electrode unit 33b at the same time as the sealing process. The conductive wire 41 can be easily formed by depositing indium tin oxide (ITO) on a bottom surface of a transparent plate 45. The cap 40 also includes a lens 43 for inducing, for example, diffusion or concentration of the light emitted from the LED 20 in a predetermined direction. The lens 43, formed on the transparent plate 45, may be made of polymer or glass in a hemispherical shape. This structure can electrically connect the LED to the electrode unit and can seal the LED at the same time. As compared with the conventional method for performing the sealing process after the electric connection process, the method of the present invention reduces the number of assembly processes.

Reference numerals 51 and 51' denote solder bumps, and 53 denotes a sealant. The sealant 53 can be made of a solder or adhesive. The sealant 53 can also be made of any kind of material which can bond the cap 40 to the substrate 30 to seal the LED 20.

Figure 4:
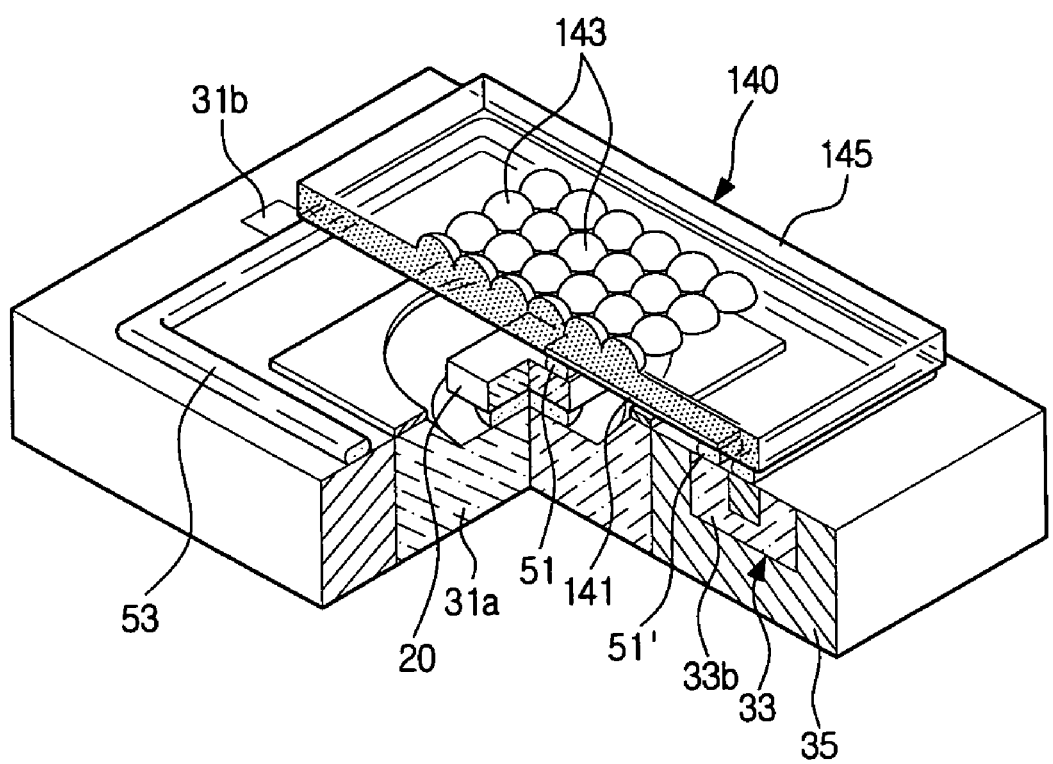
FIG. 4 is a partially-cut perspective view of an LED package in accordance with another exemplary embodiment of the present invention.

FIG. 4 is a schematic partially-cut perspective view of an LED package in accordance with another exemplary embodiment of the present invention. As depicted in FIG. 4, the LED package has a different cap structure from that explained above. In a cap 140, a plurality of micro lenses 143 are disposed on a transparent plate 145 in an array shape. A conductive wire 141 for electrically connecting the LED 20 to the second electrode unit 33b of the substrate 30 is formed at one side of the bottom surface of the cap 140. The remaining structure of the LED package of FIG. 4 is identical to that of the LED package described above, and thus same reference numerals are used and detailed explanations are omitted.

In this embodiment, the overall thickness of the package is smaller than that of a package using one hemispherical lens. Therefore, the LED package has a reduced thickness and size.

Figure 5:
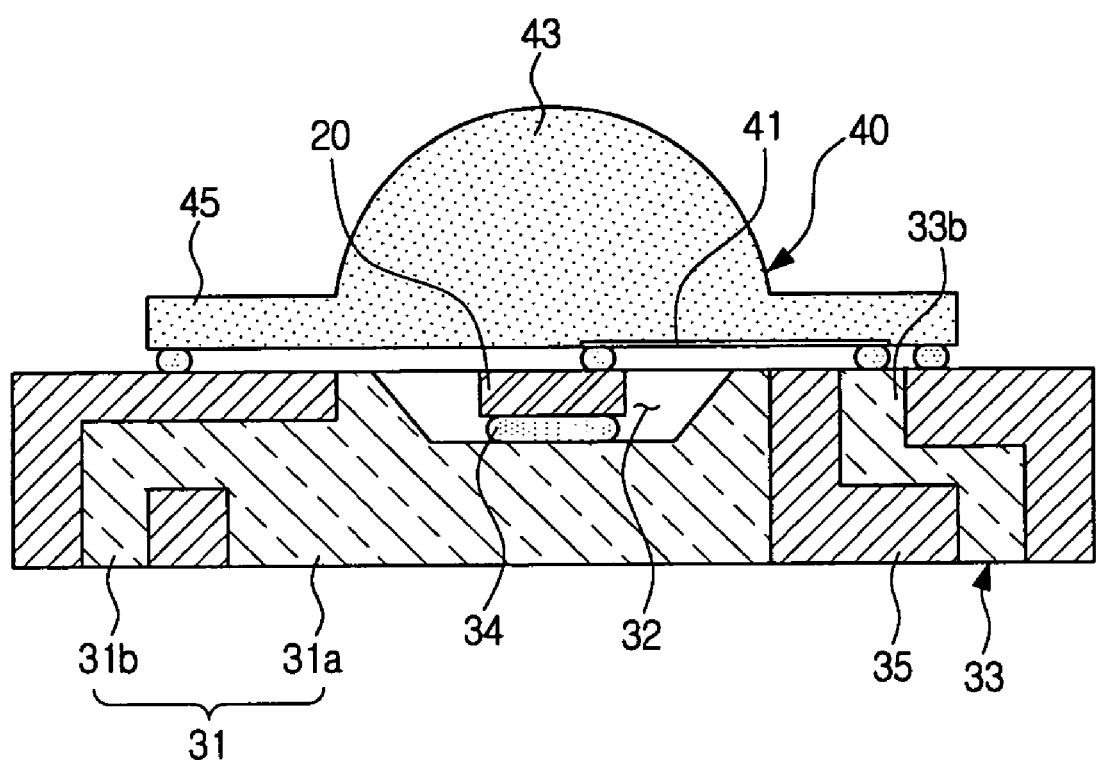
FIG. 5 is a cross-sectional view of an LED package in accordance with another exemplary embodiment of the present invention.

FIG. 5 is a schematic cross-sectional view of an LED package in accordance with another exemplary embodiment of the present invention. As shown in FIG. 5, the LED package is identical to the LED package of FIG. 2, except that the first electrode unit 31b is exposed through the bottom surface of the substrate 30 and the second electrode unit 33b is exposed through the top and bottom surfaces of the substrate 30. Accordingly, same reference numerals are used and detailed explanations are omitted. The first electrode unit 31b can be exposed through the bottom surface of the substrate 30 and the second electrode unit 33b can be exposed through the top surface of the substrate 30.

Figure 6:
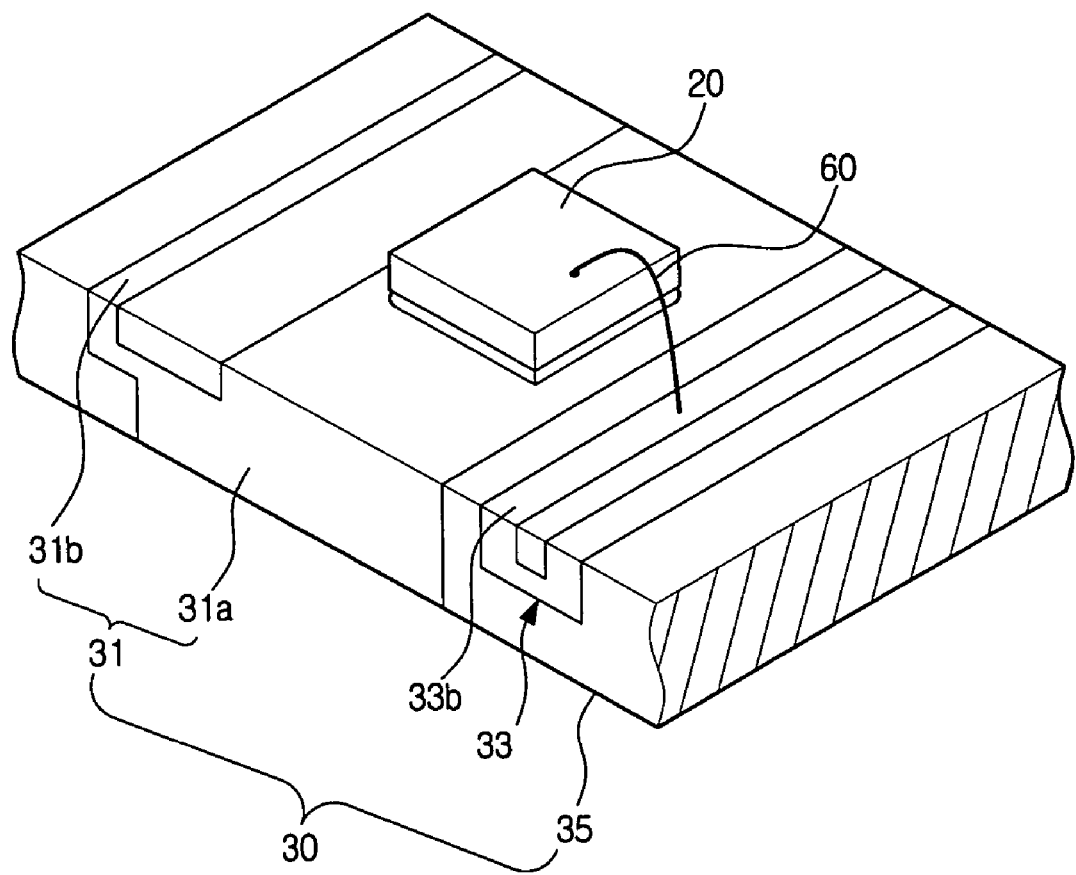
FIG. 6 is a perspective view of an LED package in accordance with another exemplary embodiment of the present invention.

FIG. 6 is a schematic perspective view illustrating an LED package in accordance with another exemplary embodiment of the present invention. Referring to FIG. 6, a metal wire 60 electrically connects the LED 20 to the second electrode unit 33b of the substrate 30. That is, when it is not necessary to seal up the LED 20, the metal wire 60 is used to simplify the whole structure. Similar to the aforementioned embodiments of the present invention, the LED package uses a substrate in which the first and second conductor units 31 and 33 are electrically insulated by the non-conductor unit 35. In addition, the LED 20 is bonded to the heat dissipation unit 31*a* of the first conductor unit 31, and the heat generated in the LED operation is transferred through the heat dissipation unit 31*a*. This LED package may also include the cap having the lens, as previously described.

Figure 7:
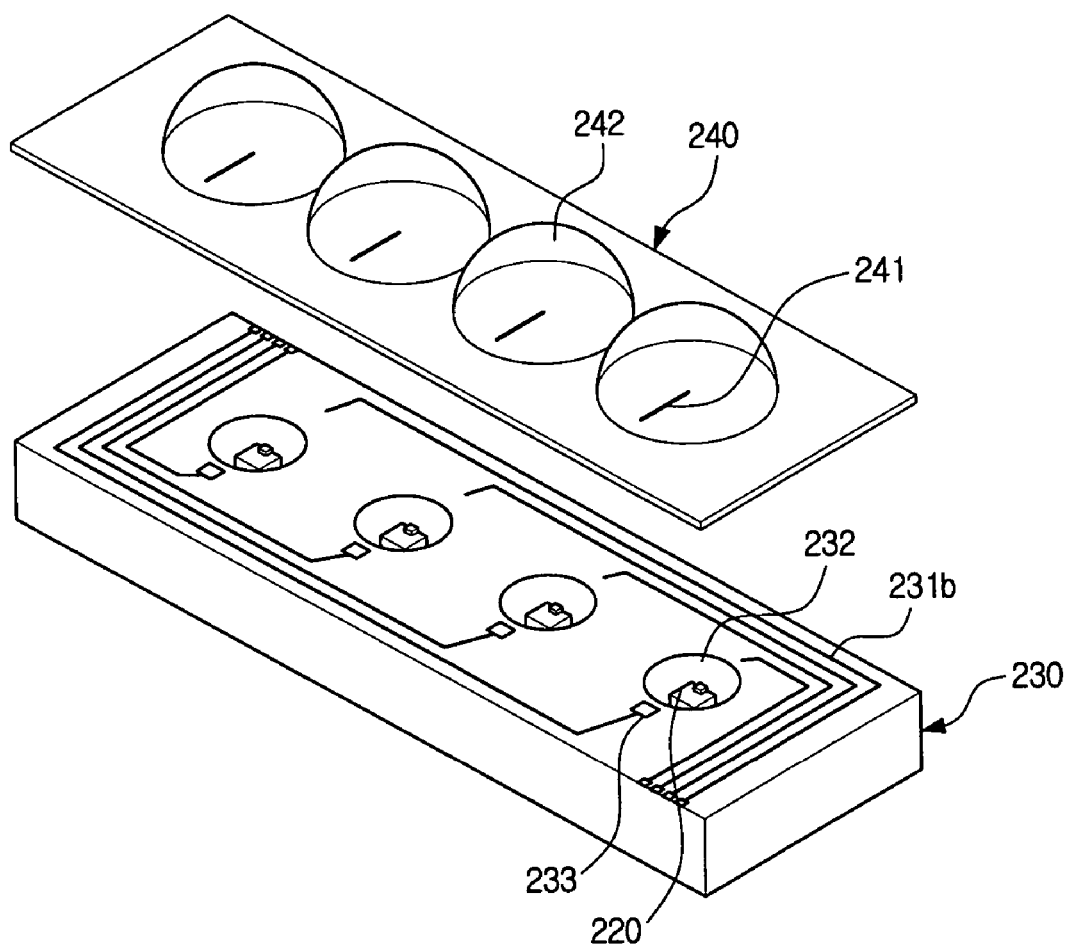
FIG. 7 is a disassembly perspective view of an LED array module in accordance with an exemplary embodiment of the present invention.

FIG. 7 is a schematic disassembly perspective view of one example of an LED array module used as, for example, a backlight unit of an LCD, using an LED package as described above.

As illustrated in FIG. 7, LEDs 220 are bonded to bottom surfaces of a plurality of cavities 232 formed on a substrate 230. Although schematically shown, the substrate 230 includes electrode units 233 each respectively having at least two conductor units and a non-conductor unit as in the LED packages explained above. Accordingly, heat dissipation units are disposed on the substrate 230 to which the LEDs 220 have been bonded. The heat dissipation units are electrically insulated by the non-conductor units to individually drive the plurality of LEDs 220, and electrode units 231*b* are connected to the heat dissipation units, respectively. In addition, a cap 240 has lenses 242 in the same number as the LEDs 220. Conductive wires 241 for electrically connecting the LEDs 220 to the electrode units 233 are formed on the bottom surfaces of the lenses 242, respectively.

Therefore, an LED array module, having excellent heat dissipation performance and a reduced thickness and size, can be manufactured at a low cost by a simple process of mounting a desired number of LEDs 220 on a substrate 230 and sealing up the LEDs 220 with a cap 240.

An exemplary manufacturing method of the LED package in accordance with the present invention will now be described in detail.

A manufacturing method of the LED package includes the steps of manufacturing a substrate on which an LED is mounted, the substrate having a first conductor unit having a heat dissipation unit exposed in the up/down direction and a first electrode unit and a second conductor unit having a second electrode unit being electrically insulated from each other by a non-conductor unit in the substrate; bonding the LED to the heat dissipation unit of the substrate; and electrically connecting the LED to the second electrode unit and sealing the LED at the same time.

The step of manufacturing the substrate may be a method of manufacturing a lamination type substrate or a method of manufacturing an oxidation type substrate. First, the method for manufacturing a lamination type substrate will now be explained with reference to FIGS. 8A to 8H.

Figure 8A:
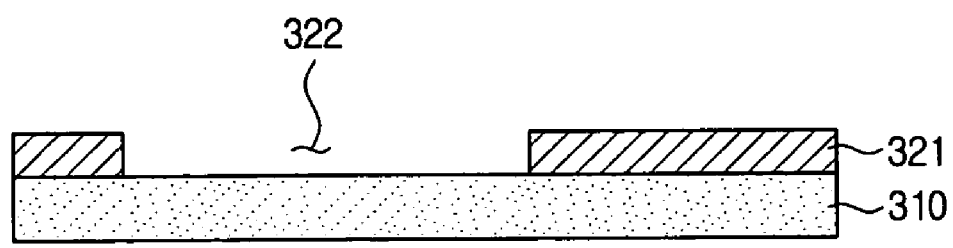
FIGS. 8A to 8H illustrate an exemplary method of manufacturing a substrate in accordance with the present invention.
Figure 8B:
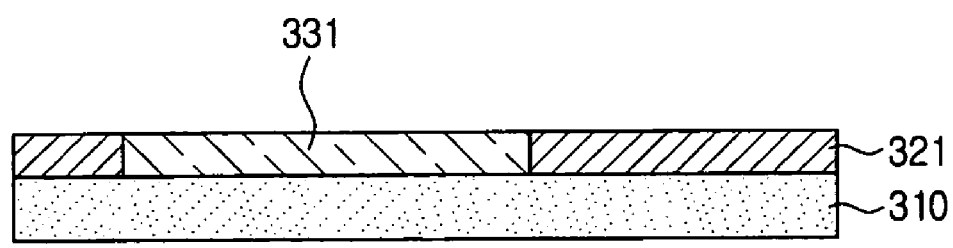

As shown in FIG. 8A, an insulator 321 is deposited on a base film 310, and a first conductor unit formation part 322 of the insulator 321 is etched. As depicted in FIG. 8B, a metal 331 is deposited in the first conductor unit formation part.

Figure 8C:
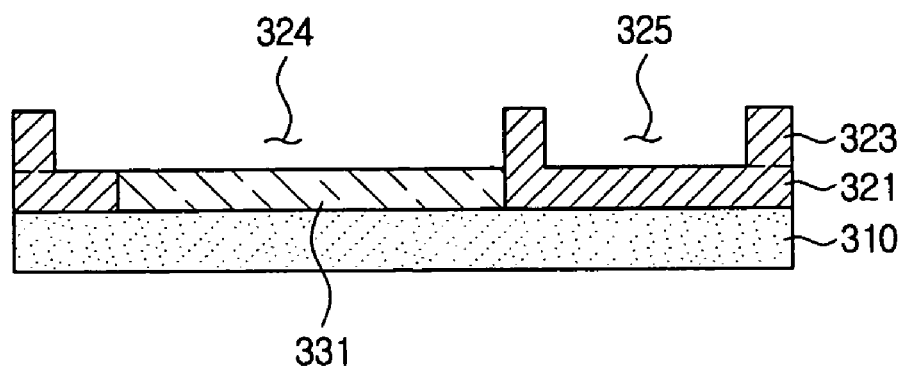
Figure 8D:
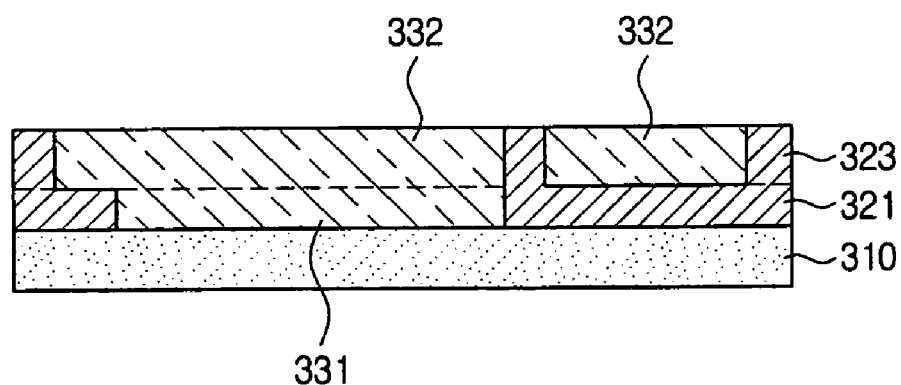

As illustrated in FIG. 8C, an insulator 323 is deposited on the insulator 321 filled with the metal 331, and a first conductor unit formation part 324 and a second conductor unit formation part 325 of the insulator 323 are etched. As shown in FIG. 8D, a metal 332 is deposited in the first conductor unit formation part 324 and the second conductor unit formation part 325.

Figure 8E:
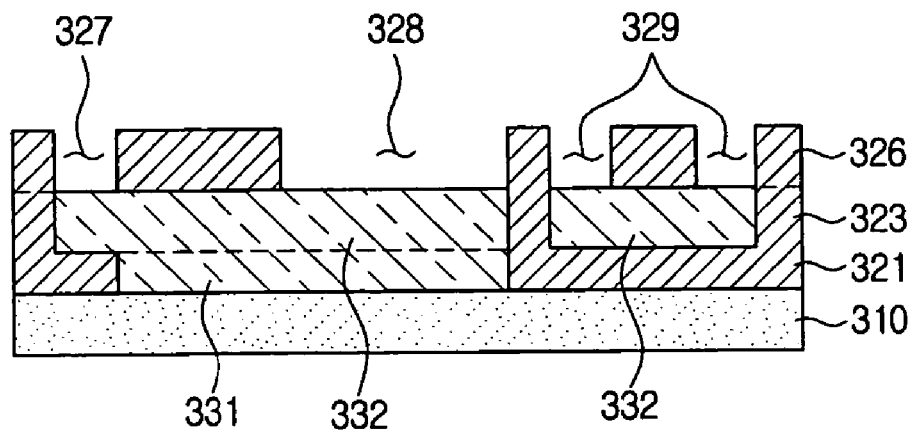

Referring to FIG. 8E, an insulator 326 is deposited on the insulator 323 filled with the metal 332, and a heat dissipation unit formation part 328 and first and second electrode unit formation parts 327 and 329 of the insulator 326 are etched.

Figure 8F:
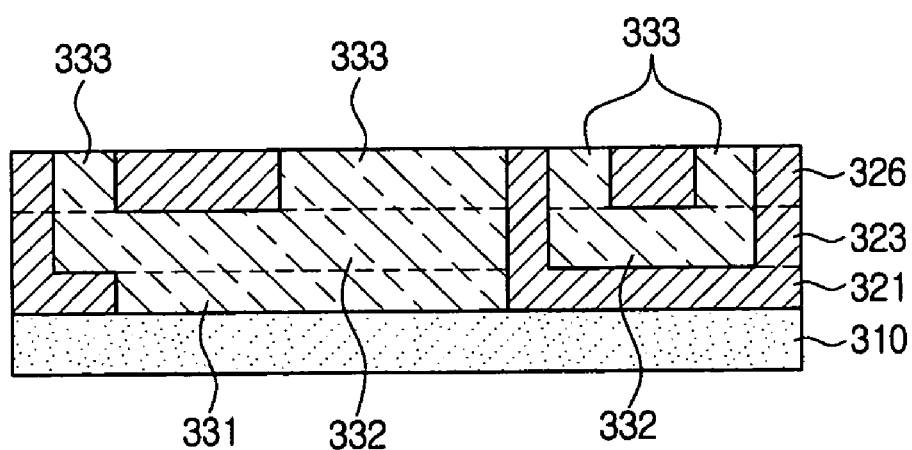

As depicted in FIG. 8F, a metal 333 is deposited in the heat dissipation unit formation part 328 and in the first and second electrode unit formation parts 327 and 329 removed in the above step.

Figure 8G:
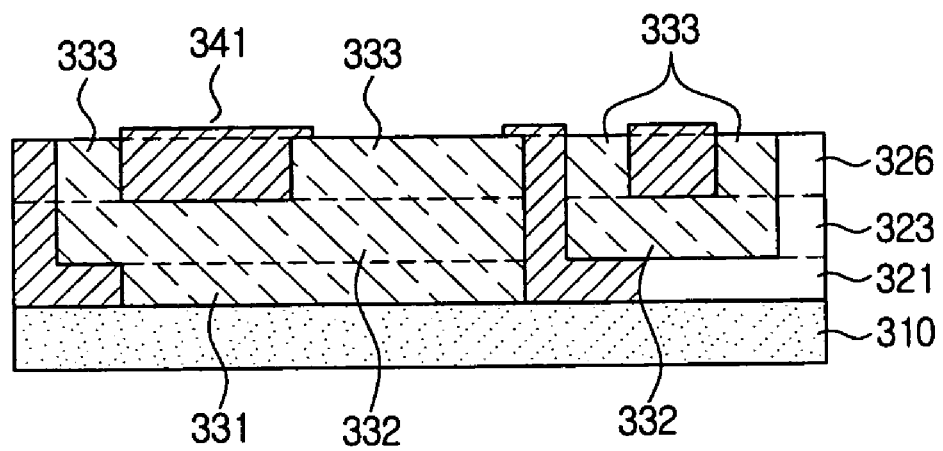
Figure 8H:
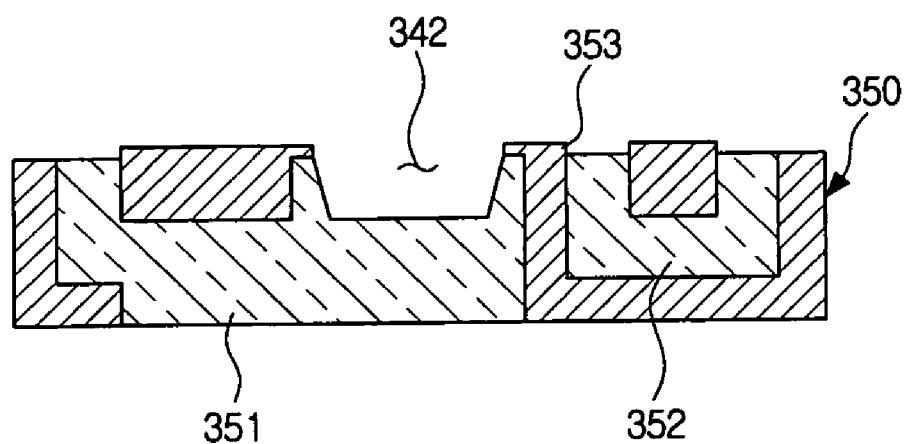

As shown in FIG. 8G, an insulator 341 is deposited and etched, and as shown in FIG. 8H, a cavity 342 is formed and the base film 310 is removed.

Figure 9:
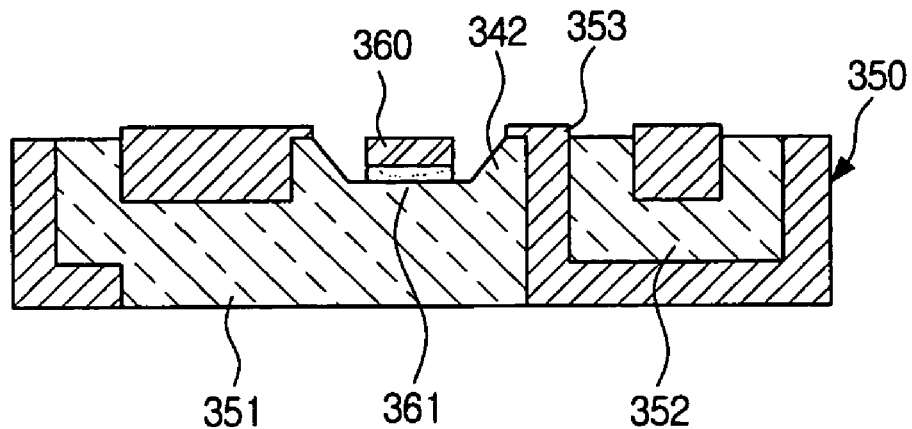
FIG. 9 is a cross-sectional view of an LED bonded to the substrate of FIGS. 8A to 8H.

The above procedure manufactures a substrate 350 in which a first conductor unit 351, divided into a heat dissipation unit and a first electrode unit, and a second conductor unit 352 are electrically insulated by a non-conductor unit 353. FIG. 9 is a cross-sectional view illustrating an LED 360 bonded to the bottom surface of the cavity 342 of the substrate 350 by a conductive adhesive 361.

FIGS. 10A to 10F are process views illustrating another example of a method for manufacturing the substrate composing the LED package in accordance with the present invention. The method for manufacturing the substrate of FIGS. 10A to 10F is a method for manufacturing an oxidation type substrate in which a substrate has conductor units and a non-conductor unit formed by partially making a metal substrate non-conductive by an oxidation process.

Figure 10A:
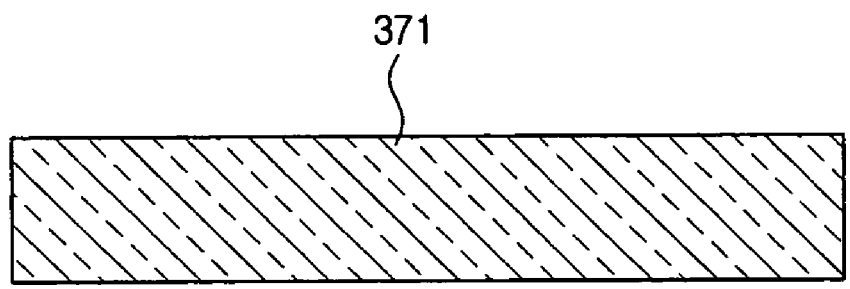
FIGS. 10A to 10F illustrate another exemplary method of manufacturing a substrate in accordance with the present invention.
Figure 10B:
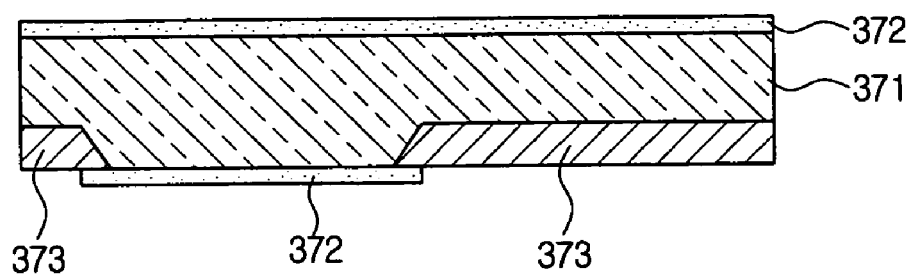

As illustrated in FIG. 10B, a photoresist 372 is coated on the top and bottom surfaces of a metal substrate 371 (e.g. an aluminum substrate) at a predetermined thickness. A predetermined part of the bottom surface, namely, the part that will be non-conductive, is opened, and a first oxidation process is performed thereon. Reference numeral 373 of FIG. 10B denotes the first oxidation part.

Figure 10C:
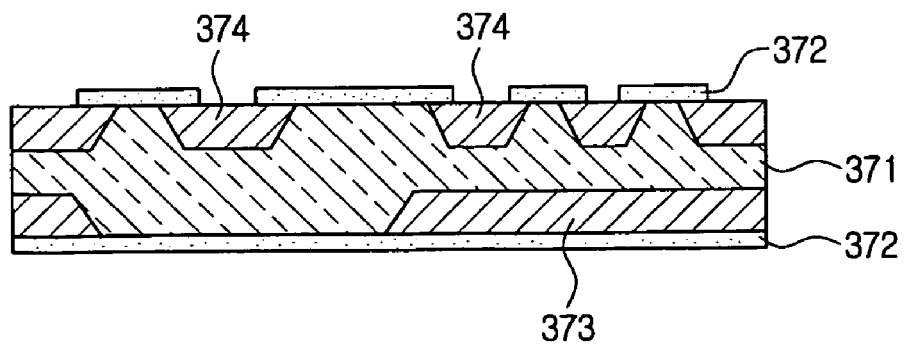

As depicted in FIG. 10C, predetermined parts of the photoresist 372 on the top surface of the substrate 371, namely, the parts that will be non-conductive, are opened, and a second oxidation process is performed thereon. Reference numeral 374 of FIG. 10C denotes the second oxidation part.

Figure 10D:
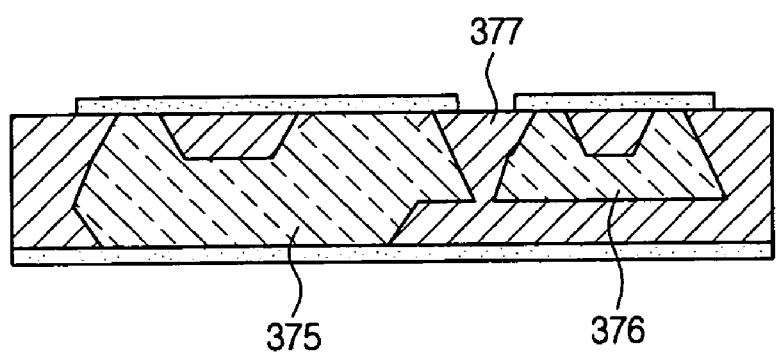
Figure 10E:
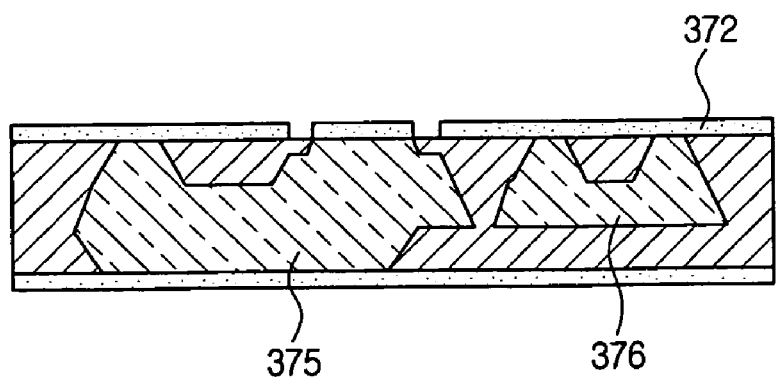
Figure 10F:
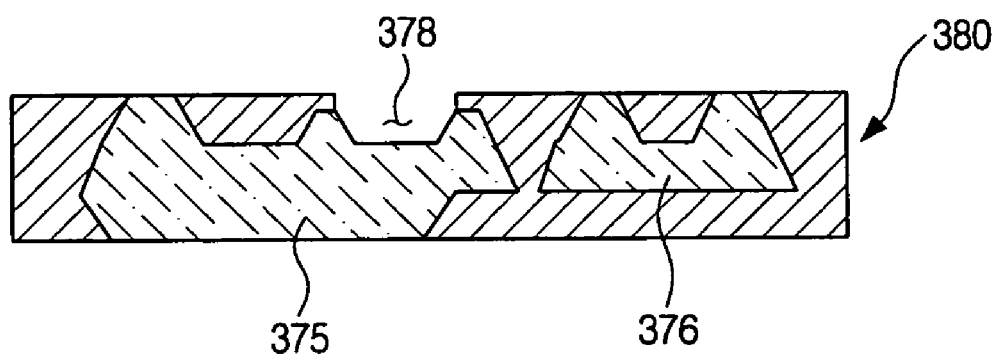

Referring to FIG. 10D, a first conductor unit 375 and a second conductor unit 376 are electrically insulated by a non-conductor unit 377 by oxidizing a necessary part of the upper portion of the substrate 371. As shown in FIG. 10E, a photoresist is stacked at the upper portion and a necessary part is opened to form a cavity. FIG. 10F shows a resultant substrate 380 having a cavity 378.

Figure 11:
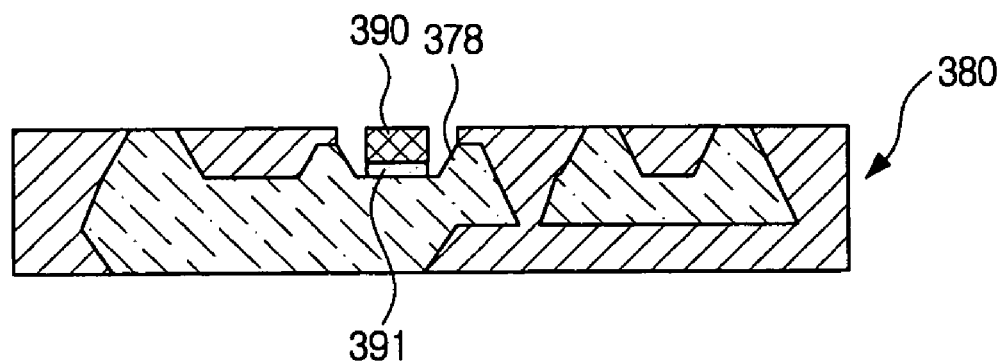
FIG. 11 is a cross-sectional view of an LED bonded to the substrate of FIGS. 10A to 10F.

As illustrated in FIG. 11, an LED 390 is bonded to the bottom surface of the cavity 378 of the substrate 380 by a conductive adhesive 391.

Figure 12A:
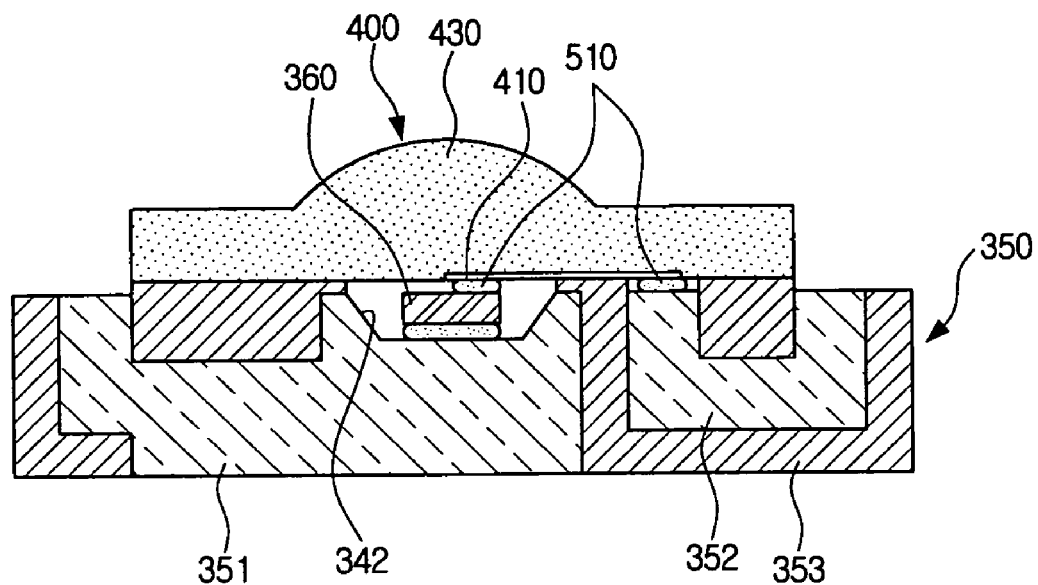
FIGS. 12A to 12C are cross-sectional views of exemplary methods of bonding a cap having a lens to an LED-bonded substrate.

FIG. 12A shows one example of bonding an LED 360 to a cavity 342 of a substrate 350, sealing the LED 360 with a cap 400, and electrically connecting the LED 360, according to the above procedure. As depicted in FIG. 12A, the cap 400 includes a conductive wire 410 and a lens 430. Solder bumps 510 are positioned between both sides of the conductive wire 410 and the LED 360 and the second conductor unit 352. In this state, the cap 400 and the substrate 350 are heated and compressed, to seal and electrically connect the LED 360 at the same time.

Figure 12B:
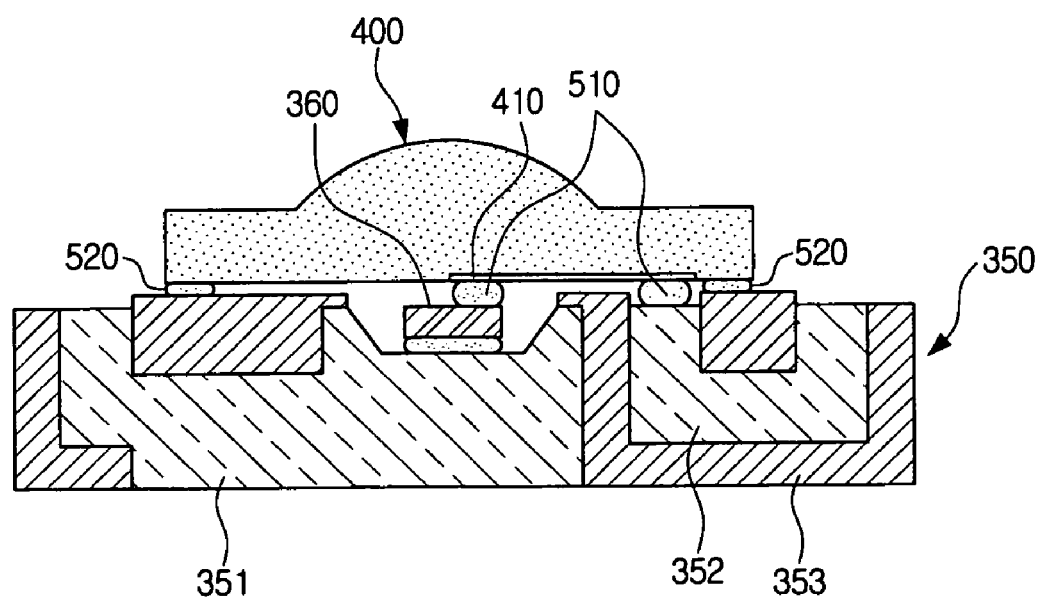
Figure 12C:
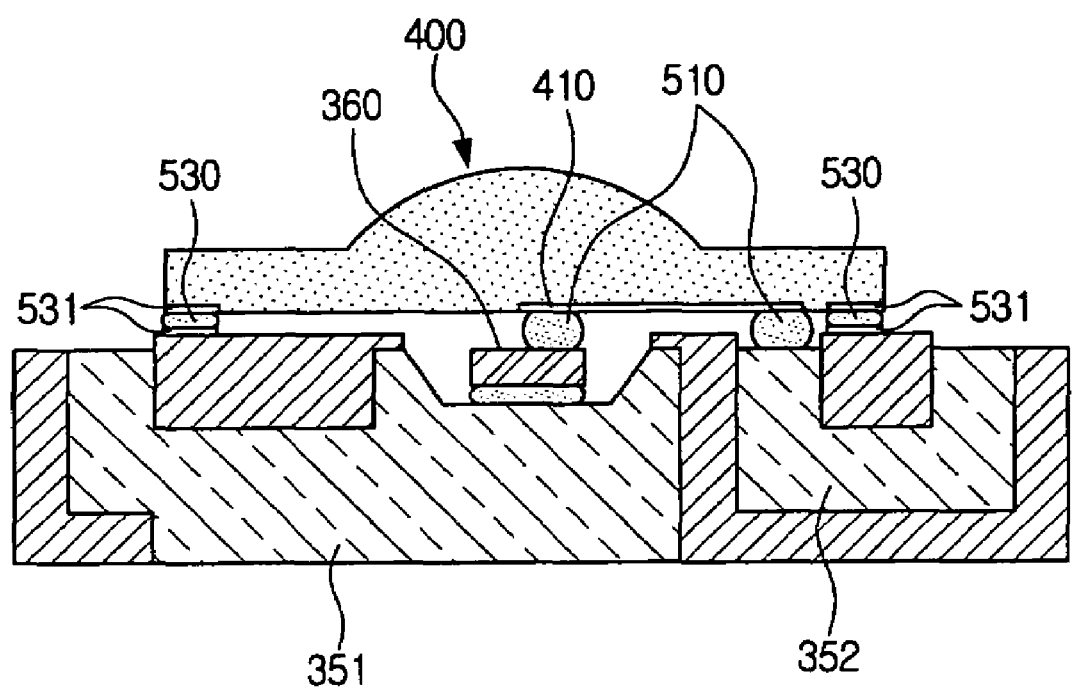

FIG. 12B shows another example of bonding the cap 400 to the substrate 350 by using the solder bumps 510 and an adhesive 520. FIG. 12C shows yet another example of bonding the cap 400 to the substrate 350 by a soldering method using the solder bumps 510 for interconnection and solder bumps 530 for bonding. In the method of FIG. 12C, metal layers 531 may be formed on the parts of the cap 400 and the substrate 350 in which the solder bumps 530 for bonding are positioned, by coating a metal for facilitating bonding, for example, Ti, Pt, Cu, Au, or Ag.

As described above, an LED array module can be easily manufactured by directly mounting a plurality of LEDs on a substrate having heat dissipation units and electrode units, and sealing and electrically connecting the LEDs via a cap having conductive wires.

As discussed earlier, in accordance with the present invention, a LED package having excellent heat dissipation performance and a reduced in thickness and size can be manufactured by a simple manufacturing process. Therefore, a high power LED package used as a backlight unit of an LCD or as a lighting apparatus can be easily manufactured at a low cost. An LED array module having high reliability can also be provided at a low cost.

The foregoing embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A light emitting diode (LED) package, comprising:
   a substrate comprising
      a first conductor unit,
      a second conductor unit, and
      a non-conductor unit which electrically insulates the first and second conductor units;
   an LED mounted on the substrate and bonded to the first conductor unit; and
   a cap mounted on the substrate over the LED, the cap comprising a conductive wire formed thereto to connect the LED to the second conductor unit.

2. A light emitting diode (LED) package:
   a first conductor unit,
   a second conductor unit, and
   a non-conductor unit which electrically insulates the first and second conductor units;
   an LED mounted on the substrate and bonded to the first conductor unit; and
   a cap mounted on the substrate over the LED, the cap comprising a conductive wire which connects the LED to the second conductor unit,
   wherein the first conductor unit comprises:
      a heat dissipation unit which externally dissipates heat generated in the LED and
      a first electrode unit; and
   the second conductor unit comprises a second electrode unit connected to the LED via the conductive wire of the cap.

3. The LED package according to claim 2, wherein the heat dissipation unit is exposed through top and bottom surfaces of the substrate, and the first and second electrode units are exposed through the top surface of the substrate.

4. The LED package according to claim 2, wherein the heat dissipation unit is exposed through top and bottom surfaces of the substrate, the first electrode unit is exposed through the bottom surface of the substrate, and the second electrode unit is exposed through the top surface of the substrate.

5. The LED package according to claim 2, wherein a cavity is formed in an upper surface of the heat dissipation unit, and the LED is bonded to a bottom surface of the cavity via a conductive adhesive.

6. The LED package according to claim 5, wherein the conductive adhesive is one of Ag-Epoxy, Ag paste, and solder.

7. The LED package according to claim 5, wherein an exposed upper surface of the heat dissipation unit is smaller than an exposed lower surface of the heat dissipation unit.

8. The LED package according to claim 1, wherein the cap comprises a lens which directs light emitted from the LED in a predetermined direction.

9. The LED package according to claim 8, wherein the lens consisting of one hemispherical lens.

10. A light emitting diode (LED) package, comprising:
    a substrate comprising:
       a first conductor unit,
       a second conductor unit, and
       a non-conductor unit which electrically insulates the first and second conductor units;
    an LED mounted on the substrate and bonded to the first conductor unit; and
    a cap mounted on the substrate over the LED, the cap comprising a conductive wire which connects the LED to the second conductor unit,
    wherein the cap comprises a lens which directs light emitted from the LED in a predetermined direction,
    wherein the lens comprises an array of a plurality of micro lenses.

11. A light emitting diode (LED) package, comprising:
    a substrate comprising:
       a first conductor unit,
       a second conductor unit, and
       a non-conductor unit which electrically insulates the first and second conductor units;
    an LED mounted on the substrate and bonded to the first conductor unit; and
    a cap mounted on the substrate over the LED, the cap comprising a conductive wire which connects the LED to the second conductor unit,
    wherein the cap comprises a lens which directs light emitted from the LED in a predetermined direction,
    wherein the conductive wire and the lens are disposed on opposite sides of the cap.

12. The LED package according to claim 11, wherein a first end of the conductive wire is connected to a top surface of the LED, and a second end thereof is connected to a top surface of the second electrode unit.

13. A light emitting diode (LED) package, comprising:
    an LED;
    a substrate, comprising:
       a first conductor unit, comprising
          a heat dissipation unit, which is exposed at an upper surface of the substrate and a lower surface of the substrate, and which provides a heat transfer path for the LED,
          a first electrode unit and
          a second conductor unit comprising a second electrode unit, and
       a non-conductor unit which insulates the first electrode unit from the second electrode unit; and
    a connection member which connects the LED to the second electrode unit;
    wherein the LED is bonded to an upper surface of the heat dissipation unit.

14. The LED package according to claim 13, wherein the connection member is a metal wire.

15. The LED package according to claim 14, wherein the first and second electrode units are each exposed through at least one of the upper and lower surfaces of the substrate.

16. The LED package according to claim 15, wherein an exposed upper surface of the heat dissipation unit is smaller than an exposed lower surface thereof.

17. A light emitting diode (LED) array module, comprising:
   a plurality of LEDs;
   a substrate comprising
      a plurality of first conductor units, each comprising
         a heat dissipation unit, which is exposed at an upper surface of the substrate and a lower surface of the substrate, and which provides a heat transfer path for an LED
         a first electrode unit and
      a plurality of second conductor units, each comprising a second electrode unit; and
      a non-conductor unit which insulates the first electrode unit from the second electrode unit; and
   a cap comprising a plurality of conductive wires, each of which connects one of the plurality of LEDs to one of the plurality of second electrode units, wherein an installation of the cap simultaneously connects the plurality of LEDs to the plurality of second electrode units via the plurality of conductive wires, and forms a seal over the LEDs;
   wherein the plurality of LEDs are bonded to the substrate at predetermined intervals.

18. The LED array module according to claim 17, wherein the cap comprises a lens which induces the light emitted from the plurality of LEDs to travel in a predetermined direction.

19. The LED array module according to claim 18, wherein the lens comprises a plurality of hemispherical lenses, wherein the number of hemispherical lenses is equal to the number of LEDs.

20. The LED array module according to claim 18 wherein the lens comprises an array of a plurality of micro lenses.

* * * * *